United States Patent [19]

Tomisawa et al.

[11] 3,818,354

[45] June 18, 1974

[54] PULSE FREQUENCY DIVIDING CIRCUIT

[75] Inventors: Norio Tomisawa, Hammamatsu; Yasuji Uchiyama, Hamakita; Takatoshi Okumura, Hamamatsu, all of Japan

[73] Assignee: Nippon Gakki Seizo Kabushiki Kaisha, Hamamatsu-shi, Shizuoka-ken, Japan

[22] Filed: Nov. 7, 1972

[21] Appl. No.: 304,451

[30] Foreign Application Priority Data

Nov. 12, 1971 Japan .............................. 46-90364
Nov. 12, 1971 Japan .............................. 46-90365
Nov. 12, 1971 Japan .............................. 46-90366

[52] U.S. Cl. ................. 328/41, 307/225 R, 328/42, 328/46, 328/48

[51] Int. Cl. ...................... H03k 21/00, H03k 21/36

[58] Field of Search ............ 328/39, 41, 42, 46, 48; 307/225

[56] References Cited

UNITED STATES PATENTS 3,375,448 3/1968 Newman et al. ................. 328/46 X
3,484,699 12/1969 Israel ................................ 328/46

*Primary Examiner*—John Zazworsky
*Attorney, Agent, or Firm*—Ladas, Parry, Von Gehr, Goldsmith & Deschamps

[57] ABSTRACT

The n-th and the $(n+1)$th stages of a shift register are connected back to its first stage respectively via gates among with either one is conductive at a time, thereby constituting a ring counter of a scale of n at one time and that of a scale of $n+1$ at another. A second counter of a scale of m counts the cycling number of the ring counter and determines which of the gates is to be conductive for every ring counting cycle. If the ring counter is set $x$ times per m cycles at a scale of $n+1$ and the rest of time at a scale of $n$, the output frequency from the ring counter becomes $1/[n + x/m]$ of an input pulse frequency on an average, while the output frequency from the second counter becomes $1/(n \cdot m + x)$ of the input frequency. Such frequency dividers are available for tone generators of electronic musical instrument.

4 Claims, 8 Drawing Figures

FIG. 3(a)
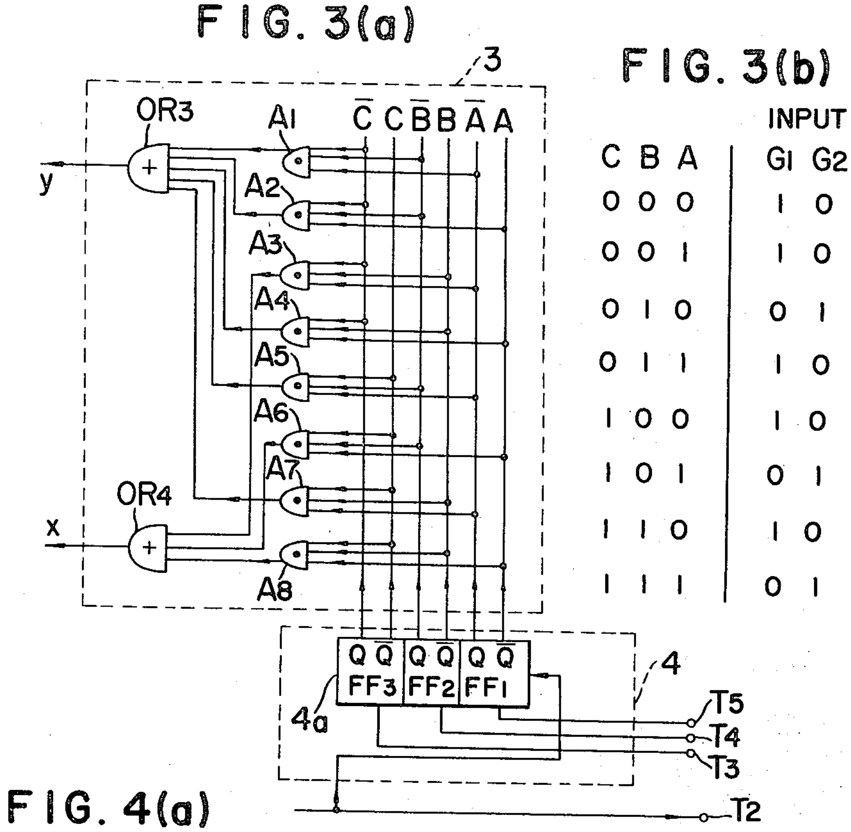
FIG. 3(b)
| C | B | A | INPUT G1 | INPUT G2 |
|---|---|---|---|---|
| 0 | 0 | 0 | 1 | 0 |
| 0 | 0 | 1 | 1 | 0 |
| 0 | 1 | 0 | 0 | 1 |
| 0 | 1 | 1 | 1 | 0 |
| 1 | 0 | 0 | 1 | 0 |
| 1 | 0 | 1 | 0 | 1 |
| 1 | 1 | 0 | 1 | 0 |
| 1 | 1 | 1 | 0 | 1 |
FIG. 4(a)
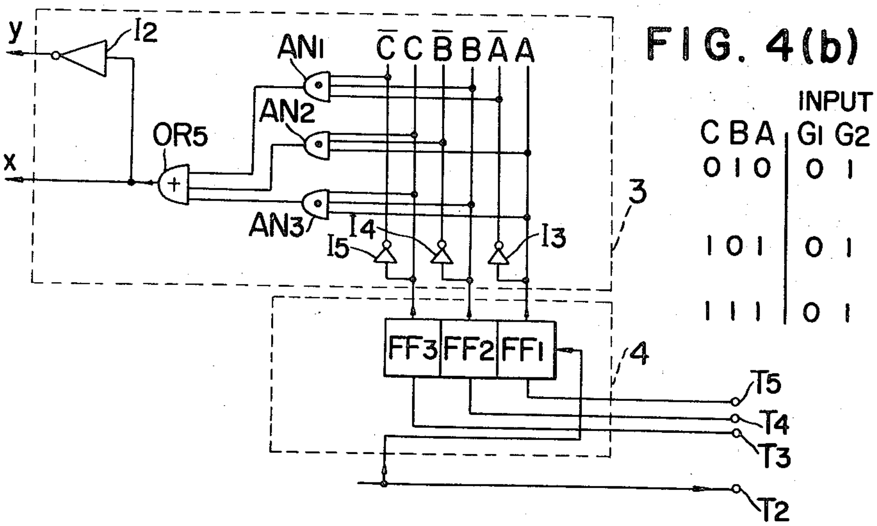
FIG. 4(b)
| C | B | A | INPUT G1 | INPUT G2 |
|---|---|---|---|---|
| 0 | 1 | 0 | 0 | 1 |
| 1 | 0 | 1 | 0 | 1 |
| 1 | 1 | 1 | 0 | 1 |

PULSE FREQUENCY DIVIDING CIRCUIT

This invention relates to a pulse frequency dividing circuit and, more particularly, to a pulse frequency dividing circuit which is capable of dividing an input frequency by a desired number which can be expressed only as the sum of an integer and a fraction, (hereinafter referred to as an "integer-fraction") as well as by any desired integer. The invention relates also to a sound source device for electronic musical instruments employing a plurality of frequency dividing circuit which are capable of dividing frequency by an integer-fraction.

There are various types of frequency dividing circuits which consist of shift registers or binary counter circuits. These frequency dividing circuits, however, are adapted to divide a pulse frequency by an integer, and they are incapable of dividing the frequency by an integer-fraction. Accordingly, in order to minimize an error between a required frequency $f_0$ which is to be obtained by frequency division and a frequency $f$ which is actually obtained, a large integer must be used as a dividing number. This requires many binary counter circuits or many stages of shift register with a result that a large number of circuit elements are required for the frequency dividing circuit. This naturally results in a high manufacturing cost.

Circuit elements can be saved in the prior art pulse frequency dividing circuit if the dividing number is an integer having prime factors. If, for example, the dividing number is 300, a counter need not have 300 stages. Instead, the counter is divided into two parts connected in series to each other with the first counter having 15 stages and the second counter having 20 stages. The whole number of counters can be minimized to 35 by this arrangement. If, however, the dividing number is an integer having no prime factors, e.g. 307, the above arrangement will not work. In this case there is no alternative but to employ a counter having 307 stages. Therefore, the problem that the circuit requires a large number of circuit elements has remained unsettled.

A certain type of tone generator circuit of an electronic musical instrument utilizes a plurality of frequency dividers which respectively divide an output frequency of a master oscillator by integers which differ from one another to produce outputs which correspond to 12 notes C, C♯, . . . B of the highest octave of the electronic musical instrument. These outputs are successively divided by two to obtain notes of successively lower octaves. In the above described tone generator system, the output frequency (1,888 MHz) of the master oscillator is divided by frequency dividers which respectively have frequency dividing ration of 1/451 through 1/239 to obtain frequencies 4,186 Hz($C_8$) through 7,902 Hz($B_8$) corresponding to the notes of the highest octave. These frequency dividers divide the frequency of the master oscillator by integers and frequencies to be obtained by the frequency division are determined in correspondence to the notes of the highest octave. Accordingly, if the frequency of the master oscillator is divided by a relatively small integer, there occurs an error between the required frequency representing a particular note and the frequency which has actually been obtained by the frequency division. In order to keep this error below a practically negligible value, each frequency divider must divide the frequency of the master oscillator by a large integer and, accordingly, the frequency of the master oscillator must be high. However, the frequency divider using a large integer as a dividing number requires a large number of circuit elements. Moreover, the master oscillator which has such a high frequency is unstable in its operation and therefore the circuit design thereof is very difficult.

It is therefore an object of the invention to provide a pulse frequency dividing circuit of a simple construction which is capable of dividing a particular frequency by an integer-fraction.

It is another object of the invention to provide a pulse frequency dividing circuit in which circuit elements can be saved even in a case wherein the dividing number is an integer having no prime or solving factors.

It is still another object of the invention to provide a tone generator system for electronic musical instruments which is capable of providing twelve note signals corresponding to the notes of the highest octave with a negligible error by provision of frequency dividing circuits which respectively divide the output frequency of the master oscillator by respective integer-fractions which differ from one another. According to the system, circuit elements can be saved and the frequency of the master oscillator can be reduced to such an extent that the master oscillator is easy to construct and stable in its operation.

Other objects and features of the invention will become apparent from the description made hereinbelow with reference to the accompanying drawings in which:

FIGS. 3a–3b and 4a–4b are block diagrams respectively showing a modified example of the second counter and a switching control circuit in FIG. 1;

Figure 1:
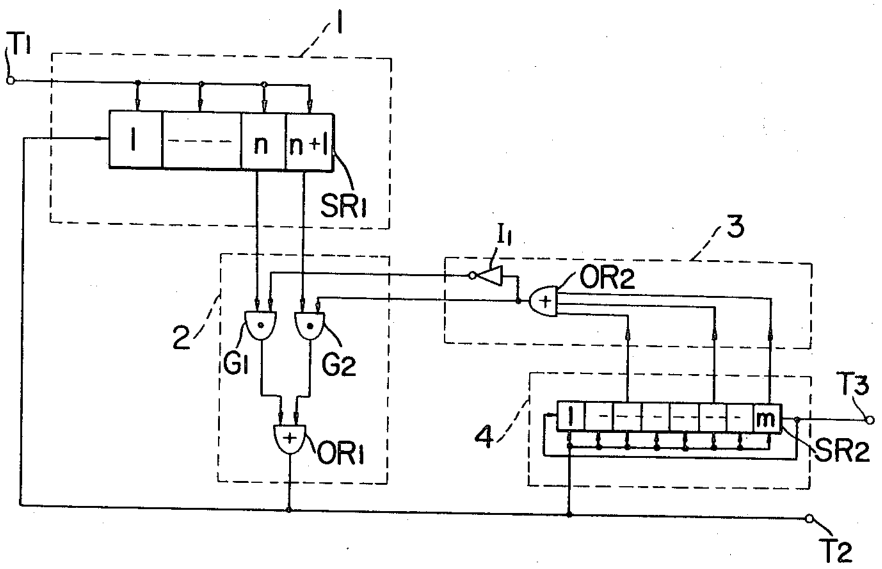
FIG. 1 is a block diagram showing one preferred embodiment of the pulse frequency dividing circuit according to the invention.

Referring first to FIG. 1, a first counter 1 consists of a shift register $SR_1$ having $n + 1$ stages or a similar device. The output side of the $n$-th stage and the $(n + 1)$th stage are respectively connected to one of the inputs of AND gates $G_1$ and $G_2$ which constitute, with an OR circuit $OR_1$, an output switching circuit 2. The output sides of the AND gates $G_1$ and $G_2$ are connected as a feed back loop to the first stage of the shift register $SR_1$ through the OR circuit $OR_1$ thereby constituting a ring counter of $n$ or $n + 1$ scale. The output signals of the AND gates $G_1$ and $G_2$ are also applied as an input pulse to a shift register $SR_2$ which constitutes a second counter 4. The shift register $SR_2$ has $m$ stages and the output signal of the stage $m$ is fed back to the first stage thereof thereby constituting a ring counter of $m$-scale. The output signals of predetermined stages of the shift register $SR_2$ are applied to the inputs of an OR circuit $OR_2$ of a switching control circuit 3. The output signal of the OR circuit $OR_2$ is applied to the other input of the AND gate $G_2$ and also to the other input of the AND gate $G_1$ through an inverter $I_1$.

In the shift registers $SR_1$ and $SR_2$, only one stage is in a state "1" at a high level and all the other stages are in a state "0" which is at a low level. This state 1 is shifted from one stage to another in these registers by application of inputs thereto.

When input pulses at a frequency $f_1$ are successively applied to an input terminal $T_1$, the state 1 in one of the stages of the shift register $SR_1$ is successively shifted to a contiguous stage. If a 1 signal having a high potential is being applied to the other input of the gate $G_1$ from the switching control circuit 3 as will be described later, the output signal of the stage $n$ is fed back to the first stage through the gate $G_1$ and the OR circuit $OR_1$. Under this condition, the shift register $SR_1$ and the feed back path through the gates $G_1$ and $OR_1$ constitute a ring counter of $n$-scale. If, on the other hand, a signal 1 is being applied to the other input of the gate $G_2$ from the cicuit 3, the output of the stage $n + 1$ is fed back to the first stage through the gate $G_2$ and the OR circuit $OR_1$. Under this condition, the shift register $SR_1$ and the feed back path through the gates $G_2$ and $OR_1$ constitute a ring counter of $(n + 1)$ scale.

Accordingly, the output pulse of the switching circuit 2 produced when the AND condition is satisfied in the gate $G_1$ has a period of $n\,\tau$ where $\tau$ is the period of the input pulses. Likewise, the output pulse of the switching circuit 2 produced when the AND condition is satisfied in the gate $G_2$ has a period of $(n + 1)\,\tau$.

When an output signal 1 at a high level is produced in, for example, the third, sixth or eighth (i.e.,$m$) stage of the shift register $SR_2$, this output signal is applied through the OR circuit $OR_2$ of the switching control circuit 3 to the other input of the gate $G_2$. On the other hand, a signal 0 at a low level is applied to the other input of the gate $G_1$ from the OR circuit $OR_2$ via the inverter $I_1$. This signal 0 prevents conduction of the gate $G_1$.

Before the state 1 is shifted to the third, sixth or eighth stage, a 0 signal at a low level is applied to the other input of the gate $G_2$ and prevents conduction thereof. In this case, the output of the inverter $I_1$ becomes a signal 1 ratio y ratio accordance at a high level and is applied to the other input of the gate $G_1$. Thus, the switching control circuit 3 controls the switching operation of the output switching circuit 2 in response to the counting operation of the second counter 4. If the number of stages used for causing the gate $G_2$ to conduct among all the $m$ counting stages of the shift register $SR_2$ is represented by $x$ and the number of stages used for causing the gate $G_1$ to conduct is represented by $y$, the switching control ratio in the present embodiment is $x : y = 3 : 5$ $(x + y = m)$. This switching control ratio can be varied in accordance with a frequency to be obtained by the frequency division.

Figure 2:
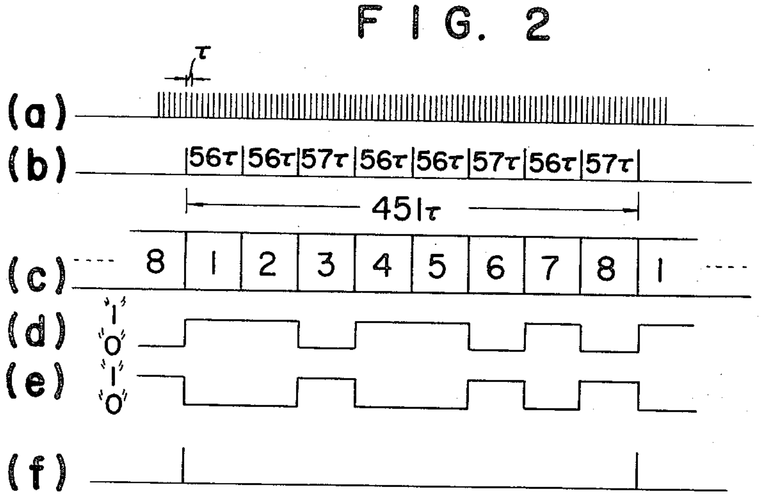
FIG. 2 is a diagram illustrating states of pulses in each part of the circuit shown in FIG. 1 and states of a second counter.

According to the above described construction, input pulses at a frequency $f_1$ are divided in frequency by a dividing number $N = n + (x/m)$ and the frequency divided output is obtained at a terminal $T_2$. This will be explained by taking an actual example. If $f_1$ is selected at 944 kHz, $n$ at 56, $m$ at 8, $x : y$ at 3 : 5, the dividing number N is expressed as $N=56(3/8)$, and the frequency $f_2$ of the frequency divided output is 16.74 kHz. FIGS. 2 (*a*) through (*e*) show the states of the pulses in each part of the circuit shown in FIG. 1 and the states of the second counter 4. FIG. 2 (*a*) shows the input pulses having a period $\tau$. FIG. 2 (*b*) shows the output pulse obtained at the terminal $T_2$. The output pulse has a period of 57 $\tau$ when the state 1 is present in the third, sixth or eighth stage of the second counter 4 and a period of 56 $\tau$ when the state 1 is present in the other stages. Accordingly, the period of the output pulse at the terminal $T_2$ for one period $(451\,\tau)$ of the second counter 4 is, on an average, $(451/8)\,\tau = 56\,(3/8)\,\tau$. Thus, the frequency of the output pulse is divided by 56 (3/8). FIG. 2 (*c*) shows the state of the second counter 4 in which each figure represents the stage in which the output 1 is produced. FIG. 2 (*d*), (*e*) show the levels of the signals applied to the gates $G_1$ and $G_2$ from the switching control circuit 3.

FIG. 3 (*a*) illustrates a modified example of the second counter and the switching control circuit. A flip-flop circuit 4*a* which consists of flip-flops $FF_1$ to $FF_3$ connected in series to each other is employed as the second counter 4. The switching control circuit 3 consists of a logic circuit which is supplied with outputs A, B and C and inverted outputs $\bar{A}$, $\bar{B}$ and $\bar{C}$ of the flip-flops $FF_1$ and $FF_3$ to discriminate thereby the states of the outputs of these flip-flops. The outputs of the flip-flops $FF_1$ to $FF_3$ are connected to the inputs of AND circuits $A_1$ to $A_8$ in accordance with truth table shown in FIG. 3 (*b*). The output signals of the AND circuit $A_1$, $A_2$, $A_4$, $A_5$ and $A_7$ are applied through an OR circuit $OR_3$ to the other input of the AND gate $G_1$, and the output signals of the AND circuits $A_3$, $A_6$ and $A_8$ are applied through an OR circuit $OR_4$ to the other input of the AND gate $G_2$. Accordingly each time a pulse is applied to the second counter 4, the states of the flip-flops $FF_1$ to $FF_3$ change from 000 to 001, . . . 111, 000. Hence, an input signal 1 at a high level is applied to the gate $G_1$ in the first, second, fourth, fifth and seventh stages and an input signal 1 at a high level is applied to the gate $G_2$ in the third, sixth and eighth stages. Let it be assumed, for convenience of description, that in FIG. 3 (*a*) and (*b*) the same switching control ratio and the manner of switching as those in the embodiment shown in FIG. 1 are used.

FIG. 4 (*a*) shows another modified example of the second counter and the switching control circuit which perform functions equivalent to those shown in FIG. 3. The second counter 4 consists of a flip-flop circuit in which flip-flops $FF_1$ to $FF_3$ are connected in series to each other. Either the outputs Q or the inverted outputs $\bar{Q}$ of the flip-flops $F_1$ to $F_3$ are applied to the switching control circuit 3. In the switching control circuit 3, each output of the flip-flops $FF_1$ to $FF_3$ is divided into two, and one of the divided outputs is inverted by inverters $I_3$ to $I_5$ to produce an inverted output. The outputs of the flip-flops $FF_1$ to $FF_3$ are connected to AND circuits $AN_1$ to $AN_3$ in accordance with a truth table shown in FIG. 4(*b*). When each of the AND circuits $AN_1$ to $AN_3$ satisfies its AND condition, a signal 1 at a high level is applied through an OR circuit $OR_5$ to the gate $G_2$. Between the OR circuit $OR_5$ and the input of the gate $G_1$ there is provided an inverter $I_2$. Hence, when each of the AND circuits $AN_1$ to $AN_3$ satisfies its AND condition, a signal 0 at a low level is applied to the gate $G_1$ to prevent conduction thereof. When the states of the flip-flops $FF_1$ to $FF_3$ are different from those shown in the truth table, AND circuits $AN_1$ to $AN_3$ do not produce outputs and the output of the inverter $I_2$ is a high level signal 1 which is applied to the input of the gate $G_1$. Thus, as the second counter 4 successively performs its counting operation, switching control signals similar to those described with reference to FIG. 3 are supplied to the gates $G_1$ and $G_2$.

The foregoing description was made about the embodiments of the pulse frequency dividing circuit in which an output is obtained at the terminal $T_2$ by dividing the clock pulse frequency by an integer-fraction. It is to be noted, however, that an output having a frequency which is obtained by dividing the clock pulse frequency by a desired integer can also be obtained at a terminal $T_3$ by a similar circuit construction. One embodiment of this circuit will be described hereinbelow with reference to FIGS. 1 thhrough 5. In the description of this embodiment, output terminals $T_2$, $T_4$ and $T_5$ in the figures are to be disregarded.

Assume that a desired frequency dividing ratio is represented by 1/N. If N is a number which has no prime solving factors, the dividing number N is $N = mn + x$ (where $m$, $n$ and $x$ are integers). FIG. 1 shows an example in which the frequency dividing ratio 1/N is obtained by using two counters. The operation of the component parts of this circuit is the same as has previously been described, so that a detailed description thereof will be omitted. In this circuit, an output having a frequency which is obtained by dividing the frequency $f_1$ of the input clock pulse by the dividing number $N = nm + x$ develops at the terminal $T_3$. An actual example will be shown for comparison with the previously described example. If $f_1$ is selected at 944 kHz, $n$ at 56, $m$ at 8, and $x : y$ at 3 : 5, the dividing number is 451 and the frequency $f_2$ of the frequency divided outputs is $f_2 = 2.09$ kHz. FIG. 2 ($f$) shows the output pulse obtained at the terminal $T_3$. This pulse has a period of $56\tau x\ 5 + 47\tau \times 3 = 451\tau$ as can best be seen in the figure.

Figure 5:
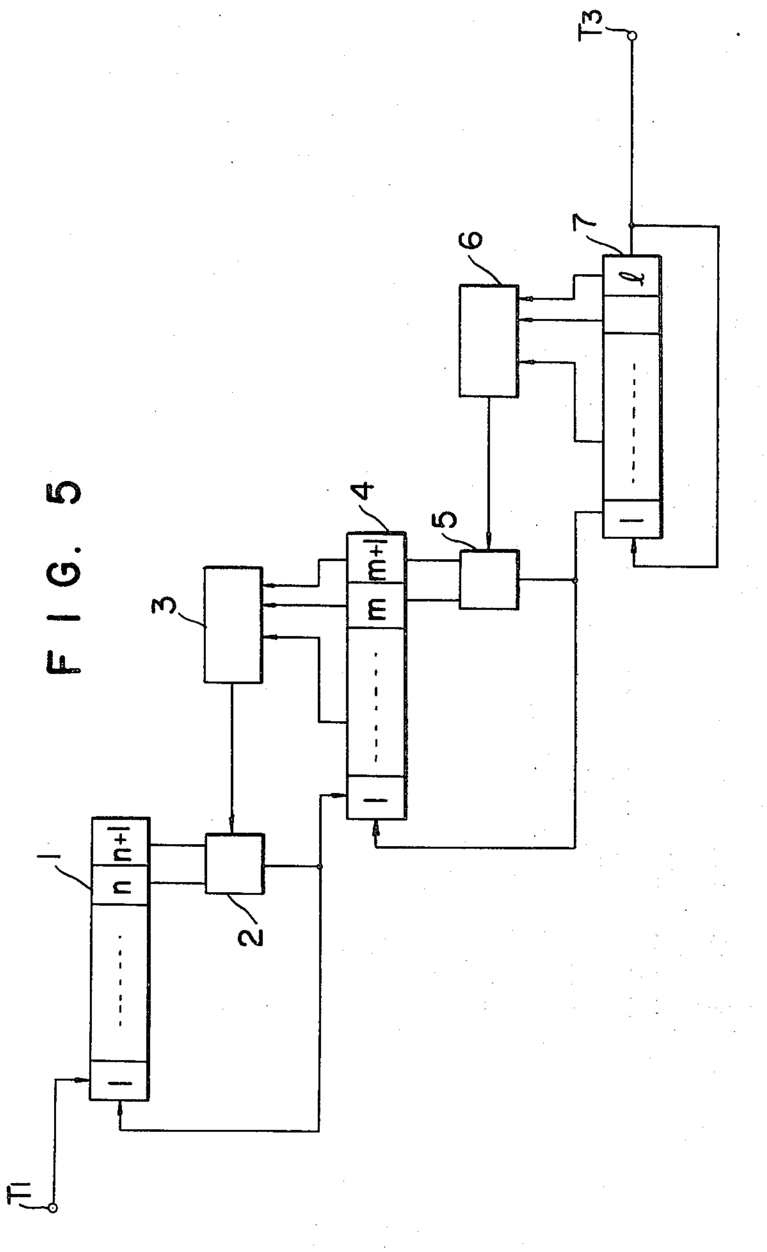
FIG. 5 is a block diagram showing another embodiment of the pulse frequency dividing circuit according to the invention.

In the foregoing embodiment, the number of the stages $n$ of the first counter and the number of the stages $m$ of the second counter can be selected at suitable numbers relative to a desired frequency dividing number. If integers which are in closest proximity to $\sqrt{N}$ are selected as $m$ and $n$, the total number of stages is about $2\ \sqrt{N}$, which is the smallest number available. Again, the number of the counters used is not limited to two, but three or more counters may be used as shown in FIG. 5. In the circuit shown in FIG. 5, there are provided counters 1, 4 and 7 There are also provided output switching circuits 2 and 5 as well as switching control circuits 3 and 6 respectively in connection with the counters 1 and 4. This circuit operates in the same principle as in the foregoing embodiment and a frequency divided output at a desired divided frequency can be obtained.

If three or more counters are used, the total number of counter stages can be minimized by selecting the number of the stages in each counter at an integer which is in proximity to $\sqrt{N}$ when $k$ is the number of the counters. Suppose the number of stages in each counter in the case of using three counters is selected at $\sqrt{N}$. The total number of stages will become $3 \times \sqrt{N}$. It will be apparent from this that the total number of the counter stages decreases if the number of counters increases. However, increase of the counters is accompanied by increase of the switching circuits and the switching control circuits. Therefore, the number of counters should preferably be determined by taking into account such increases of the switching circuits and the switching control circuits.

It will be apparent from the above description of the operation principle that the modified examples of the switching control circuits respectively shown in FIG. 3 and FIG. 4 described with reference to the pulse frequency dividing circuit in which the input frequency is divided by integer-fraction are applicable to this embodiment. In a construction in which many counters are connected to each other, the counters as shown in FIGS. 3 and 4 are used as a last stage counter and other counters are constituted of shift registers or similar devices.

Figure 6:
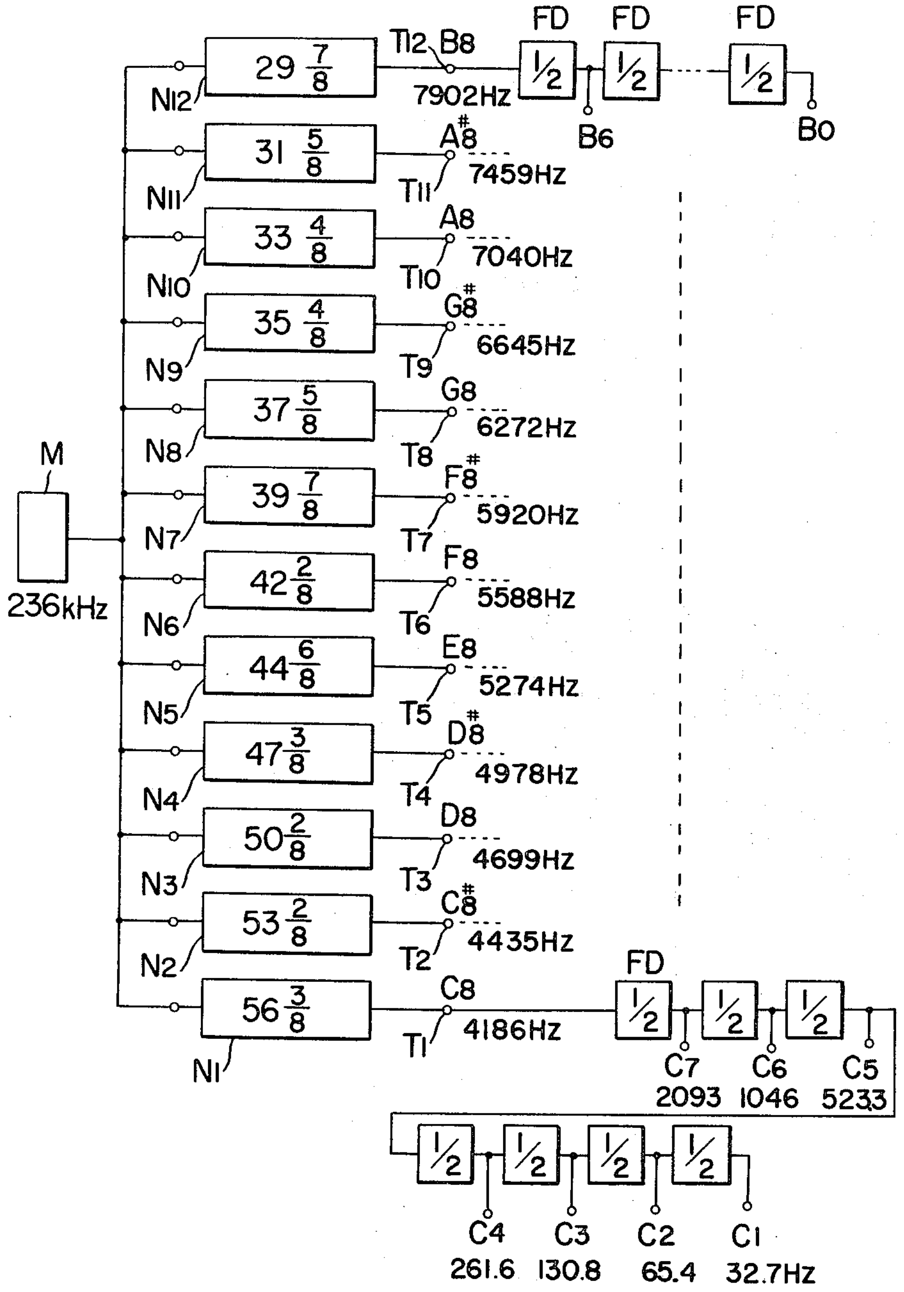
FIG. 6 is a block diagram showing an embodiment of a tone generator system for an electronic musical instrument according to the invention.

FIG. 6 is a block diagram showing one embodiment of a tone generator assembly, for an electronic musical instrument which is capable of producing a plurality of tone signals by dividing the frequency of a master oscillator M in a plurality of frequency dividing circuits having dividing numbers of integer-fraction which differs from one another. In this embodiment, notes of the highest octave are represented by $C_8$ through $B_8$. The output frequency of the master oscillator M is selected at 236 kHz, and the output at this frequency is fed to frequency dividing circuits $N_1$ to $N_{12}$. The frequency dividing circuits $N_1$ to $N_{12}$ respectively have dividing numbers of 56(⅜) to 29(⅞) as shown in the figure which respectively represent the notes $C_8$ to $B_8$. Accordingly, frequencies of 4,186 Hz to 7,902 Hz are respectively obtained at terminals $T_1$ to $T_{12}$ corresponding to the notes $C_8$ to $B_8$. The frequency dividing circuits $N_1$ to $N_{12}$ have the same construction as the frequency dividing circuits previously described with reference to FIGS. 1 through 4 in which the frequency divided output is obtained at the terminal $T_2$. The number of stages $n + 1$ of the first counter, the number of stages $m$ of the second counter and the switching control ratio $x : y$ are determined depending upon the frequency dividing ratio. If these numbers are selected at $n = 56$, $m = 8$ and $x : y = 3 : 5$ for the frequency dividing circuit $N_1$, the dividing number is 56(⅜) and, accordingly, the frequency of the note $C_8$ obtained at the terminal $T_1$ is 4,186 Hz. Likewise, the other note signals are obtained at the terminals $T_2$ to $T_{12}$. These note signals are successively divided by two by means of dividers FD to produce note signals of successively lower octaves.

If flip-flops connected in series are used as the second counter as shown in FIGS. 3 and 4, the output of each of the flip-flops may be used as a tone generator of a frequency divided note signal. Referring to FIGS. 3 and 4, a note signal having a frequency which is one half that of the note signal obtained at the terminal $T_2$ and therefore being one ocatave lower is obtained at the output terminal $T_5$ of the flip-flop $FF_1$. Similarly, a note signal which is two octaves lower than the signal obtained at the terminal $T_2$ is obtained at the output terminal $T_4$ of the flip-flop $FF_2$ and a note signal which is three octaves lower is obtained at the output terminal $T_3$ of the flip-flop $FF_3$. The output note signal of the flip-flop $FF_3$ is applied to two dividers connected in series to successively obtain required note signals.

Taking the note signal $C_8$ as an example, each output pulse of the frequency dividers up to the stage where the frequency of the note signal $C_8$ is divided to ⅛ is subjected to phase fluctuation. This phase fluctuation, however, practically causes no problem in functioning of these output pulses as note signals. After $C_4$, the output pulses have a completely equal period without being sujected to such phase fluctuation.

In the foregoing embodiments, the gate circuits $G_1$ and $G_2$ and the OR circuit $OR_1$ are provided as the output switching circuit for switching the output of the first counter. If the input frequency is relatively low, other device such as relays may be used.

What we claim is:

1. A pulse frequency dividing circuit comprising a first counter driven by an input pulse, an output switching circuit for switching the output pulses of a stage $n + 1$ and the output pulses of a stage $n$ of said first counter and feeding back either of these output pulses to the input of the first stage of said first counter, a second counter having stages to provide scale of $m$ and receiving the output pulses of said output switching circuit as a counter input, a switching control circuit for controlling the switching operation of said output switching circuit in response to output pulses from a required counter stage or stages of said second counter and means for taking out pulses at a frequency which is $1/[n + (x/m)]$ of an input pulse frequency by selecting the number of said required stage or stages at $x$ to determine the switching ratio of the output from the stage $n + 1$ and that from the stage $n$ at $x : (m - x)$.

2. A pulse frequency dividing circuit comprising a first counter driven by an input pulse, an output switching circuit for switching the output pulses of a stage $n+1$ and the output pulses of a stage $n$ of said first counter and feeding back either of these output pulses to the input of the first stage of said first counter, a second counter having stages to provide scale of $m$ and receiving the output pulses of said output switching circuit as a counter input, a switching control circuit for controlling the switching operation of said output switching circuit in response to output pulses from a required counter stage or stages of said second counter and means for taking out pulses at a frequency which is $1/(mn+x)$ of an input pulse frequency by selecting the number of said required stage or stages at $x$ to determine the switching ratio of the output from the stage $n + 1$ and the output from the stage $n$ as $x : (m - x)$

3. A pulse frequency dividing circuit as defined in claim 2 in which, when a frequency dividing ratio to be obtained is 1/N, the numbers of the stages $n$ and $m$ of said first and second counters are resepctively selected at integers which are in close proximity to $\sqrt{N}$.

4. A pulse frequency dividing circuit comprising a first to Nth counter (N $\geqq$ 3), said first counter receiving input pulses, output switching circuits in the number of N−1 respectively provided for the first to N−1th counters for switching the output pulses of the last stage and the output pulses of the last but one stage of the corresponding counters and feeding back the output pulses to the first stage of said corresponding counters, the output pulses of each of the output switching circuits being applied to the next counter connected in series, switching control circuits in the number of N−1 respectively provided for the output switching circuits for controlling the switching operation of said output switching circuits in response to output pulses from a required counter stage or stages of the next counters and means for feeding back the output pulses of the Nth counter directly to the first stage of said Nth counter, pulses at a frequency which is of a required frequency dividing ratio relative to a clock pulse frequency being obtained from the output of said Nth counter.

* * * * *